United States Patent
Kwon et al.

(10) Patent No.: US 10,148,067 B2
(45) Date of Patent: Dec. 4, 2018

(54) DISTRIBUTED BRAGG REFLECTOR TUNABLE LASER DIODE

(71) Applicant: ELECTRONICS AND TELECOMMUNICATIONS RESEARCH INSTITUTE, Daejeon (KR)

(72) Inventors: Oh Kee Kwon, Daejeon (KR); Chul-Wook Lee, Daejeon (KR); Su Hwan Oh, Daejeon (KR); Kisoo Kim, Seoul (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/712,874

(22) Filed: Sep. 22, 2017

(65) Prior Publication Data

US 2018/0205200 A1    Jul. 19, 2018

(30) Foreign Application Priority Data

Jan. 19, 2017    (KR) .................. 10-2017-0009346

(51) Int. Cl.
*H01S 5/125*    (2006.01)
*H01S 5/0625*   (2006.01)
(Continued)

(52) U.S. Cl.
CPC .............. *H01S 5/125* (2013.01); *G02B 6/12* (2013.01); *H01S 5/0612* (2013.01);
(Continued)

(58) Field of Classification Search
CPC ...... H01S 5/125; H01S 5/0612; H01S 5/1221; H01S 5/20; H01S 5/06256; G02B 6/12; G02B 2006/12107
See application file for complete search history.

(56) References Cited

U.S. PATENT DOCUMENTS 7,224,708 B2    5/2007    Sin et al.
7,486,709 B2    2/2009    Hu et al.
(Continued)

FOREIGN PATENT DOCUMENTS

JP    2000-49411    *    2/2000
KR    10-2012-0020961 A    3/2012

OTHER PUBLICATIONS

Brian R. Bennett et al., "Carrier-Induced Change in Refractive GaAs, and InGaAsP", IEEE Journal of Quantum Electronics, vol. 26, No. I , Jan. 1990, p. 113-122.
(Continued)

*Primary Examiner* — Dung Nguyen
(74) *Attorney, Agent, or Firm* — Rabin & Berdo, P.C.

(57) ABSTRACT

Provided is a distributed Bragg reflector tunable laser diode including a substrate provided with a gain section having an active waveguide from which a gain of laser light is obtained and a distributed reflector section having a passive waveguide connected to the active waveguide, wherein the distributed reflector section includes gratings disposed on or under the passive waveguide, a current injection electrode disposed on the passive waveguide and configured to provide a current into the passive waveguide to electrically tune a wavelength of the laser light, and a heater electrode disposed on the current injection electrode and configured to heat the passive waveguide to thermally tune the wavelength
(Continued)

of the laser light, wherein the gratings, the current injection electrode, and the heater electrode vertically overlap each other.

14 Claims, 9 Drawing Sheets

(51) Int. Cl.
    *H01S 5/20*         (2006.01)
    *H01S 5/12*         (2006.01)
    *H01S 5/06*         (2006.01)
    *G02B 6/12*         (2006.01)

(52) U.S. Cl.
    CPC ........ *H01S 5/06256* (2013.01); *H01S 5/1221* (2013.01); *H01S 5/20* (2013.01); *G02B 2006/12107* (2013.01)

(56) References Cited

U.S. PATENT DOCUMENTS

| | | |
|---|---|---|
| 8,213,478 B2 | 7/2012 | Park et al. |
| 8,774,243 B2 | 7/2014 | Kim et al. |
| 2010/0311195 A1 | 12/2010 | Matsui et al. |
| 2014/0321488 A1 | 10/2014 | Chen et al. |
| 2015/0092798 A1 | 4/2015 | Ishikawa |
| 2015/0331298 A1* | 11/2015 | Yagi .................. G02F 1/2255 385/2 |

OTHER PUBLICATIONS

S. L. Woodward et al., "A DBR Laser Tunable by Resistive Heating", IEEE Photonics Technology Letters, vol. 4, No. 12, Dec. 1992, p. 1330-1332.

S. Wang, "Principles of distributed feedback and distributed Bragg-reflector lasers,", IEEE J. Quantum Electron., vol. 10, No. 4, pp. 413-427, Apr. 1974.

Ximeng Han et al., "Numerical Analysis on Thermal Tuning Efficiency and Thermal Stress of a Thermally Tunable SG-DBR Laser", IEEE Photon. Journal, vol. 8, No. 3, 1501512, Jun. 2016.

T. Koch et al, "Continuously tunable 1.5 μm multiple-quantum well GaInAs/GaInAsP distributed-Bragg-reflector lasers,", Electron. Lett., vol. 24, No. 23, pp. 1431-1433, Nov. 1988.

\* cited by examiner

DISTRIBUTED BRAGG REFLECTOR TUNABLE LASER DIODE

CROSS-REFERENCE TO RELATED APPLICATIONS

This U.S. non-provisional patent application claims priority under 35 U.S.C. § 119 of Korean Patent Application No. 10-2017-0009346, filed on Jan. 19, 2017, the entire contents of which are hereby incorporated by reference.

BACKGROUND

The present disclosure herein relates to a laser device, and more particularly, to a distributed Bragg reflector (DBR) tunable laser diode in which a wavelength of a laser light is electrically and thermally tunable.

A typical DBR tunable laser diode may be a longitudinal single-mode light source and a wavelength tunable laser. The typical DBR tunable laser diode may include a gain section and a DBR section. The gain section, a phase section and the DBR section may be monolithically integrated in a waveguide type in a semiconductor substrate.

SUMMARY

An exemplary embodiment of the inventive concept disclosure provides a distributed Bragg reflector tunable laser diode in which a wavelength of a laser light is efficiently tunable.

An exemplary embodiment of the inventive concept provides a distributed Bragg reflector tunable laser diode. The laser diode comprises a substrate including: a gain section which has an active waveguide to get a gain of laser light; and a distributed reflector section which has a passive waveguide connected to the active waveguide. Here the distributed reflector section may include: gratings disposed on or under the passive waveguide; a current injection electrode disposed on the passive waveguide and configured to provide a current into the passive waveguide to electrically tune a wavelength of the laser light; and a heater electrode disposed on the current injection electrode and configured to heat the passive waveguide to thermally tune the wavelength of the laser light. The gratings, the current injection electrode, and the heater electrode may vertically overlap each other.

In an embodiment, the gain section may further include: a first lower electrode under the active waveguide; a first lower clad between the first lower electrode and the active waveguide; a first upper clad disposed on the active waveguide; and a first upper electrode disposed on the first upper clad.

In an embodiment, the distributed reflector section may further include: a second lower clad connected to the first lower clad and surrounding the gratings; and a second upper clad connected to the first upper clad and disposed on the passive waveguide.

In an embodiment, the distributed reflector section may further include a second lower electrode connected to the first lower electrode and disposed under the second lower clad.

In an embodiment, the gain section may further include a first contact electrode between the first upper clad and the first upper electrode. The distributed reflector section may further include a second contact electrode between the second upper clad and the current injection electrode.

In an embodiment, the distributed reflector section may further include an insulation layer between the current injection electrode and the heater electrode. The insulation layer may be disposed between the first and second contact electrodes.

In an embodiment, the distributed reflector section may further include: first and second pads connected to the current injection electrode and the heater electrode; and first and second columns disposed between the first and second pads and between the first and second lower clads.

In an embodiment, the first and second columns may include benzocyclobutene.

In an embodiment, the substrate may further include a phase section between the gain section and the distributed reflector section.

In an embodiment, the heater electrode may have a straight line shape, an uneven shape, a comb shape, or a mesh shape.

In an embodiment, the substrate may include InP.

In an embodiment, the current may reduce a wavelength of the laser light.

In an embodiment, the wavelength of the laser light may be increased by heating the passive waveguide.

In an embodiment of the inventive concept, a distributed Bragg reflector tunable laser diode includes: a lower electrode; a lower clad disposed on the lower electrode; gratings disposed in one side of the lower clad; a waveguide including a passive waveguide on the one side of the lower clad and an active waveguide on another side of the lower clad, the active waveguide generating laser light; an upper clad on the waveguide; a current injection electrode disposed on one side of the upper clad and configured to provide a current into the passive waveguide to electrically tune a wavelength of the laser light; an insulation layer disposed on the current injection electrode; and a heater electrode disposed on the insulation layer and configured to heat the upper clad, the passive waveguide, and the lower clad to thermally tune the wavelength of the laser light. Here the gratings, the current injection electrode, and the heater electrode may vertically overlap each other.

In an embodiment, the lower electrode may be disposed under the other side of the lower clad.

In an embodiment, the distributed Bragg reflector tunable laser diode further includes a contact electrode disposed between the upper clad and the current injection electrode and aligned with the gratings, the current injection electrode, and the heater electrode.

In an embodiment, the wavelength of the laser light may be reduced by the current and increased by heating the passive waveguide.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, specific embodiments will be described in detail with reference to the accompanying drawings. Advantages and features of the present invention, and methods for achieving the same will be cleared with reference to exemplary embodiments described later in detail together with the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The present disclosure is defined by only scopes of the claims. Throughout this specification, like numerals refer to like elements.

The terms and words used in the following description and claims are to describe embodiments but are not limited the inventive concept. As used herein, the singular forms "a," "an" and "the" are intended to include the plural forms as well, unless the context clearly indicates otherwise. It will be further understood that the terms "comprises" and/or "comprising" used herein specify the presence of stated components, operations and/or elements but do not preclude the presence or addition of one or more other components, operations and/or elements. In addition, a solder, blocks, powders, a spacer, and a magnetic field may be understood as mainly used meanings. In addition, as just exemplary embodiments, reference numerals shown according to an order of description are not limited to the order.

Figure 1:
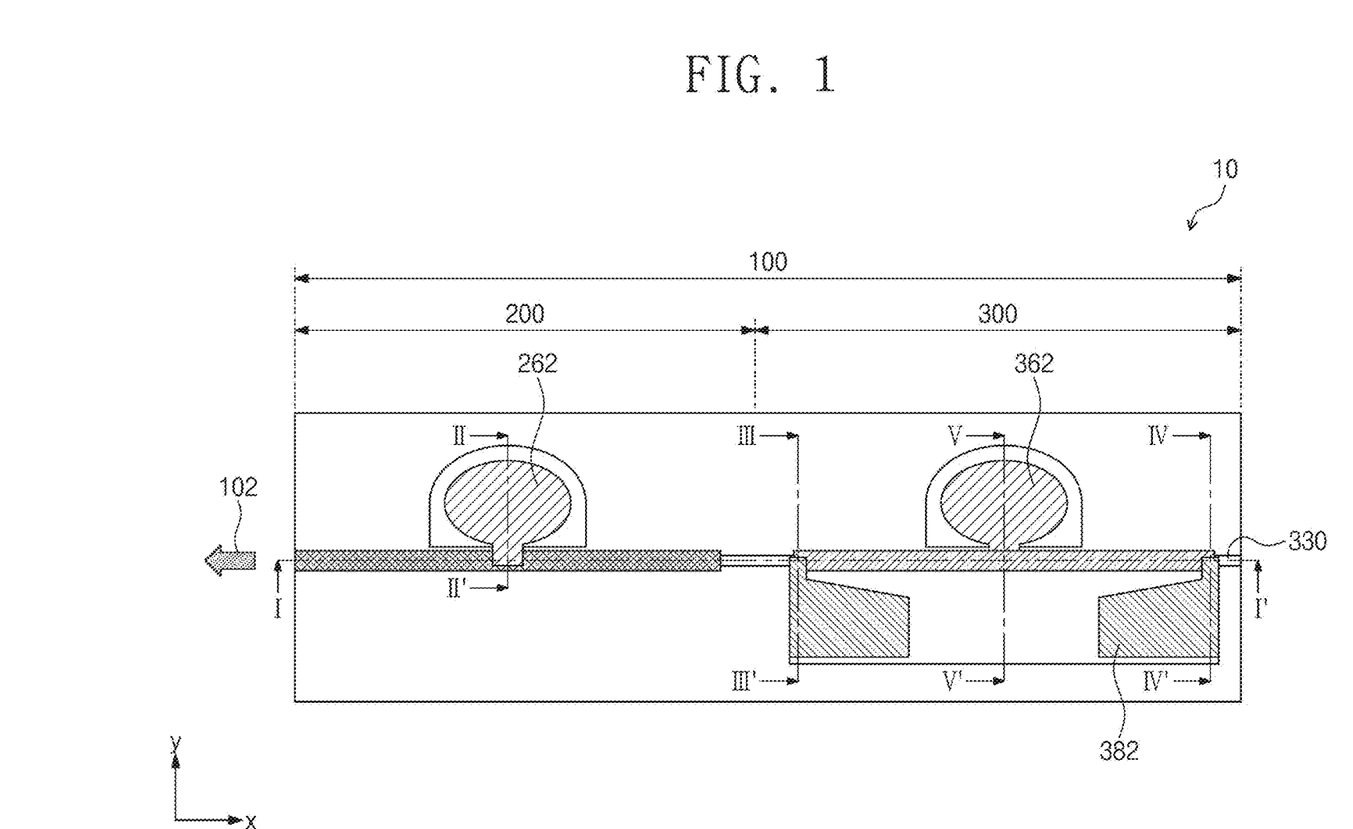
FIG. 1 is a plan view showing an example of a distributed Bragg reflector tunable laser diode according to an embodiment of the inventive concept.
Figure 2:
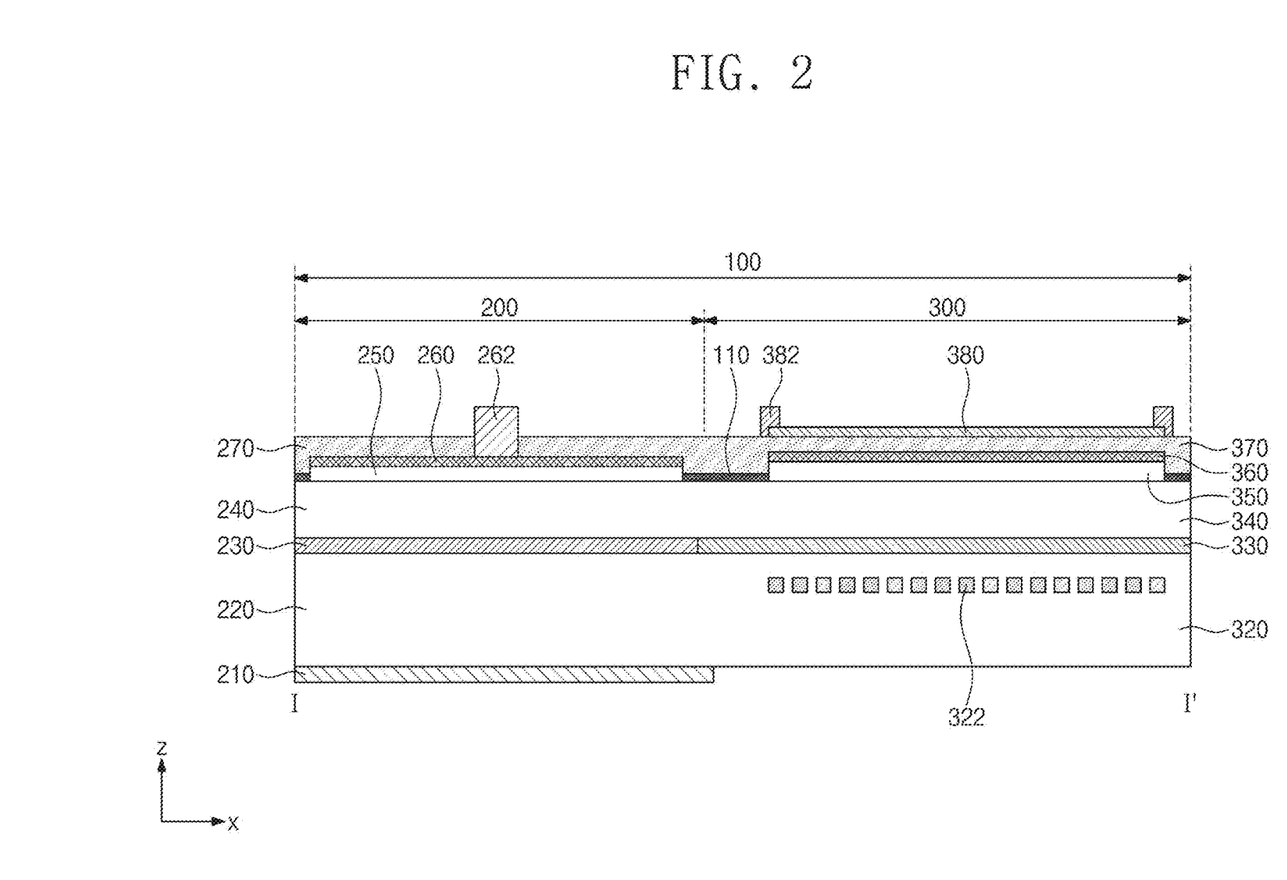
FIG. 2 is a cross-sectional view taken along line I-I' of FIG. 1.

FIG. 1 is a plan view showing an example of a distributed Bragg reflector tunable laser diode 10 according to an embodiment of the inventive concept. FIG. 2 is a cross-sectional view taken along line I-I' of FIG. 1.

Referring to FIG. 1, the distributed Bragg reflector tunable laser diode 10 of an embodiment of the inventive concept may be a wavelength tunable laser. For example, the distributed Bragg reflector tunable laser diode 10 may be monolithically integrated in an InP substrate 100. The distributed Bragg reflector tunable laser diode 10 may resonate single mode laser light 102. According to an example, the substrate 100 of the distributed Bragg reflector tunable laser diode 10 may include a gain section 200 and a distributed reflector section 300. The gain section 200 may oscillate the laser light 102 by source power. On the contrary, the gain section 200 may generate an optical signal of the laser light 102 according to a current signal of the source power. The distributed reflector section 300 may thermally and/or electrically change a refractive index of the InP substrate to tune the wavelength of the laser light 102. The gain section 200 and the distributed reflector section 300 may be continuously connected. Hereinafter, for convenience of explanation, the gain section 200 and the distributed reflector section 300 of the substrate 100 will be separately described.

Referring to FIGS. 1 and 2, the gain section 200 may generate and amplify the laser light 102. According to an embodiment, the gain section 200 may include a first lower electrode 210, a first lower clad 220, an active waveguide 230, a first upper clad 240, a first Ohmic contact layer 250, a first upper electrode 260, and a first insulation layer 270.

The first lower electrode 210 may be disposed on a bottom of the gain section 200. For example, the first lower electrode 210 may include a metal of gold, silver, aluminum, tungsten, molybdenum, manganese, indium, or lead. The first lower electrode 210 may be grounded.

The first lower clad 220 may be disposed on the first lower electrode 210. For example, the first lower clad 220 may include n-type InP.

The active waveguide 230 may be disposed on the first lower clad 220. The active waveguide 230 may extend in a first direction. For example, the active waveguide 230 may extend in an x direction. The active waveguide 230 may have a higher refractive index than the first lower clad 220. According to an example, the active waveguide 230 may include intrinsic InGaAsP or InGaAs. The active waveguide 230 may oscillate the laser light 102. The active waveguide 230 may have a multiple quantum well (MQW) structure. In addition, the active waveguide 230 may have a gain medium (not shown). The gain medium may include InGaAs or InGaAsP.

Figure 3:
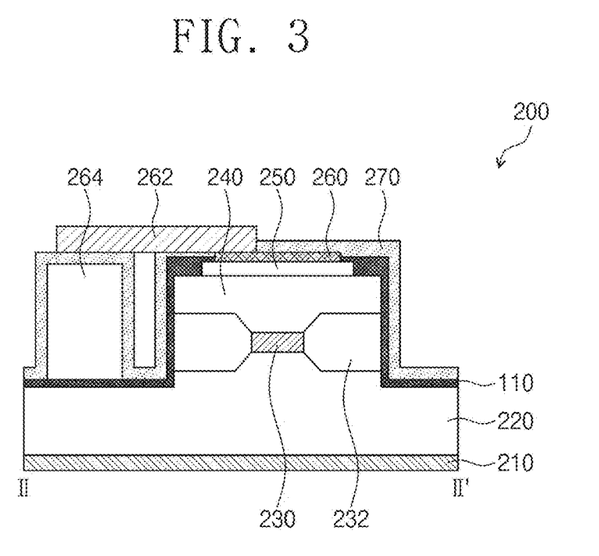
FIG. 3 is a cross-sectional view taken along line II-II' of FIG. 1.

FIG. 3 is a cross-sectional view taken along on line II-II' of FIG. 1.

Referring to FIG. 3, a first current blocking layer 232 may be disposed at both sides of the active waveguide 230. The first current blocking layer 232 may concentrate a source current between the first lower electrode 210 and the first upper electrode 260 to the active waveguide 230. The first current blocking layer 232 may include a compound semiconductor different from that of the active waveguide 230.

Referring to FIGS. 1 to 3, the first upper clad 240 may be disposed on the active waveguide 230 and the current blocking layer 232. The first upper clad 240 may have a lower refractive index than the active waveguide 230. The first upper clad 240 may include p-type InP.

The first Ohmic contact layer 250 may be disposed on the first upper clad 240. The first Ohmic contact layer 250 may remove and/or minimize a contact resistance between the first upper clad 240 and the first upper electrode 260. For example, the first Ohmic contact layer 250 may include p-type InGaAs. The Ohmic contact layer 250 and the first upper electrode 260 may have a Schottky junction. The Ohmic contact layer 250 may be provided to have an Ohmic junction with the first upper electrode 260 through a rapid-thermal annealing (RTA) process.

The first upper electrode 260 may be disposed on the first Ohmic contact layer 250. The first upper electrode 260 may be connected to a first pad 262. The first pad 262 may be disposed on a first column 264 and the first insulation layer 270. An isolation layer 110, the first column 264 and the first insulation layer 270 may be disposed between the first pad 262 and the first lower clad 220. The isolation layer 110, the first column 264 and the first insulation layer 270 may insulate the first pad 262 from the first lower clad 220. The isolation layer 110 may insulate the first pad 262 from the first upper clad 240 and the first Ohmic contact layer 250. For example, the first column 264 may include benzocyclobutene or polyimide. The first insulation layer 270 may include silicon oxide ($SiO_2$) or silicon nitride $SiN_x$.

When source power is provided between the first upper electrode 260 and the first lower electrode 210, the oscillating light of the laser light 102 may be generated in the active waveguide 230. When a data signal is embedded in the source power, the laser light 102 may be modulated to an optical signal. For example the optical signal may be modulated in a high speed at about 1 GHz or higher.

Referring to FIGS. 1 and 2 again, the distributed reflector section 300 may resonate with the oscillating laser light 102. According to an example, the distributed reflector section 300 may include a second lower clad 320, gratings 322, a passive waveguide 330, a second upper clad 340, a second Ohmic contact layer 350, a first current injection electrode 360, a second insulation layer 370, and a heater electrode 380.

The second lower clad 320 may be connected to the first lower clad 220. For example, the second lower clad 320 may include n-type InP. The first and second lower clads 220 and 320 may be one successive layer.

The gratings 322 may be disposed in the second lower clad 320. Unlike this, the gratings 322 may be disposed in the second upper clad 340 on the passive waveguide 330. The top surface of the gratings 322 may be lower than that of the second lower clad 320. The gratings 322 may be separately disposed in the x direction. The gratings 322 may reflect the laser light 102. The active waveguide 230, the passive waveguide 330 and the gratings 322 may resonate with the laser light 102. The gratings 322 may be formed of a material different from that of the second lower clad 320. For example, the gratings 322 may include n-InGaAsP. The gratings 322 may satisfy a Bragg condition $m\lambda=2n_{eq}\Lambda$, where m is an order of diffraction of 1, $\lambda$ is a wavelength of a light, $n_{eq}$ is an effective refractive index of a guiding layer, and $\Lambda$ is a period of a refractive grating. For example, the wavelength $\lambda$ of the laser light 102 may be determined depending on the passive waveguide 330 and/or an effective refractive index $n_{eq}$ of the second lower clad 320.

The passive waveguide 330 may be connected to the active waveguide 230. The passive waveguide 330 may extend in the x direction. The passive waveguide 330 may be disposed on the second lower clad 320. The passive waveguide 330 may be provided on the gratings 322. The passive waveguide 330 may include intrinsic InGaAsP or InGaAs. The laser light 102 may travel along the passive waveguide 330.

Figure 4:
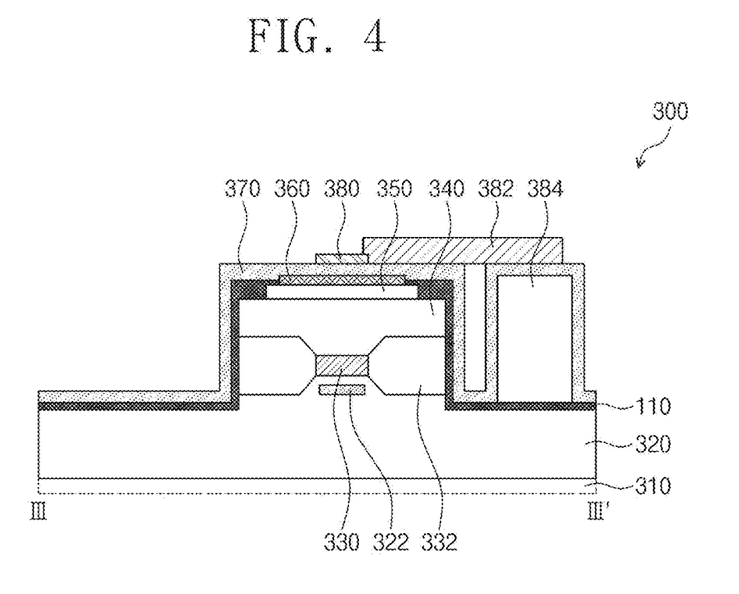
FIGS. 4 and 5 are cross-sectional views taken along lines of and IV-IV'.
Figure 5:
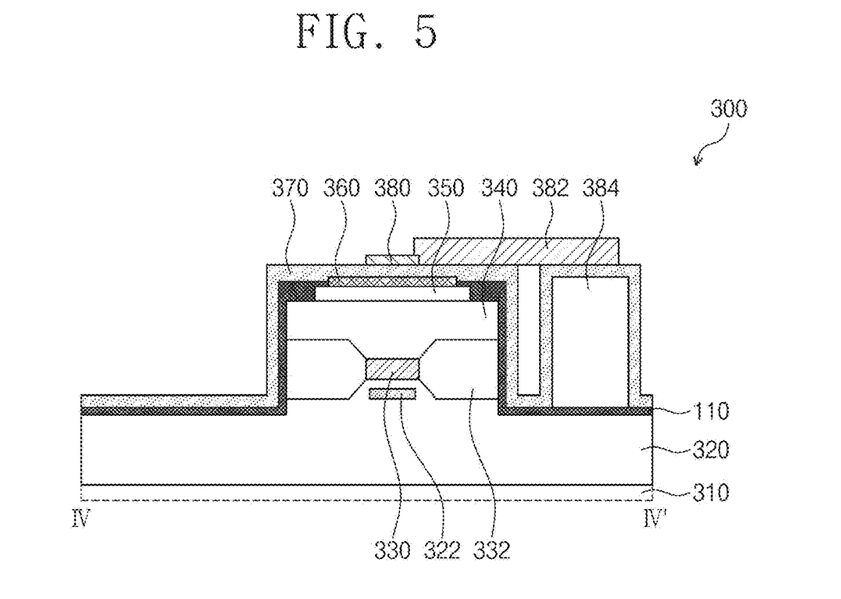

FIGS. 4 and 5 are cross-sectional views taken along lines of and IV-IV'.

Referring to FIGS. 4 and 5, the second blocking layer 332 may be disposed between both side walls of the passive waveguide 330. The second current blocking layer 332 may be connected to the first current blocking layer 232 of FIG. 3. The first and second current blocking layers 232 and 332 may be one successive layer. The second current blocking layer 332 may concentrate, into the passive waveguide 330, a wavelength tuning current between the first current injection electrode 360 and the first lower electrode 210. The second current blocking layer 332 may include a compound semiconductor different from that of the passive waveguide 330.

According to an example, the second lower electrode 310 may be disposed under the second lower clad 320. The second lower electrode 310 may be grounded. The second current blocking layer 332 may concentrate, into the passive waveguide 330, a wavelength tuning current between the first current injection electrode 360 and the second lower electrode 310. Unlike this, the second lower electrode 310 may be omitted and when there is not the second lower electrode 310, the wavelength tuning current may flow between the first current injection electrode 360 and the first lower electrode 210.

The second upper clad 340 may be connected to the first upper clad 240. The first and second lower clads 240 and 320 may be one successive layer. The second upper clad 340 may be disposed on the passive waveguide 330 and the second current blocking layer 332. The second upper clad 340 may be disposed on the first upper clad 240. The second upper clad 340 may include p-type InP.

The second Ohmic contact layer 350 may be disposed on the second upper clad 340. The second Ohmic contact layer 350 may remove and/or minimize contact resistance between the second upper clad 340 and the first current injection electrode 360.

The first current injection electrode 360 may be disposed on the second Ohmic contact layer 350. For example, the first current injection electrode 360 may overlap the gratings 322.

Figure 6:
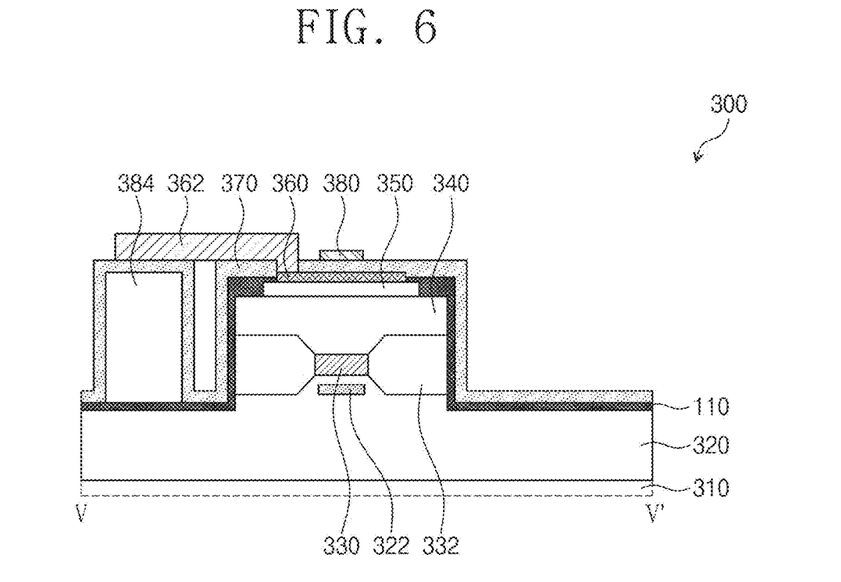
FIG. 6 is a cross-sectional view taken along line V-V' of FIG. 1.
Figure 7:
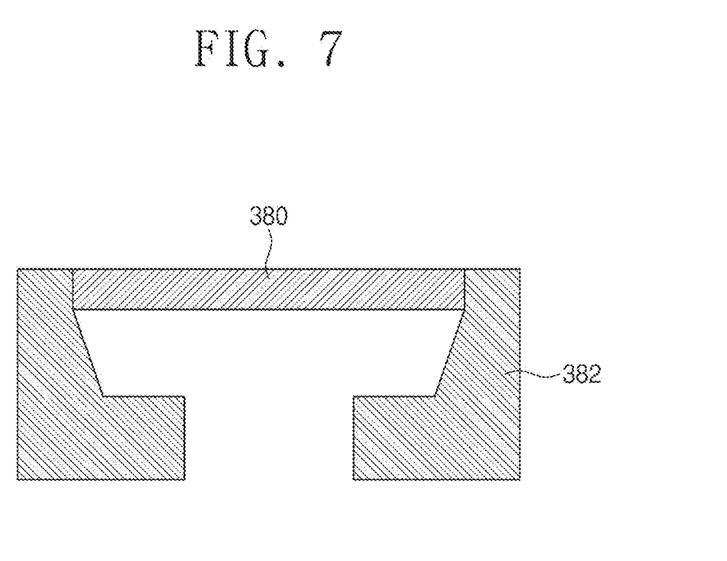
FIGS. 7 to 10 are plan views showing examples of a heater electrode and a third pad of FIG. 1.
Figure 8:
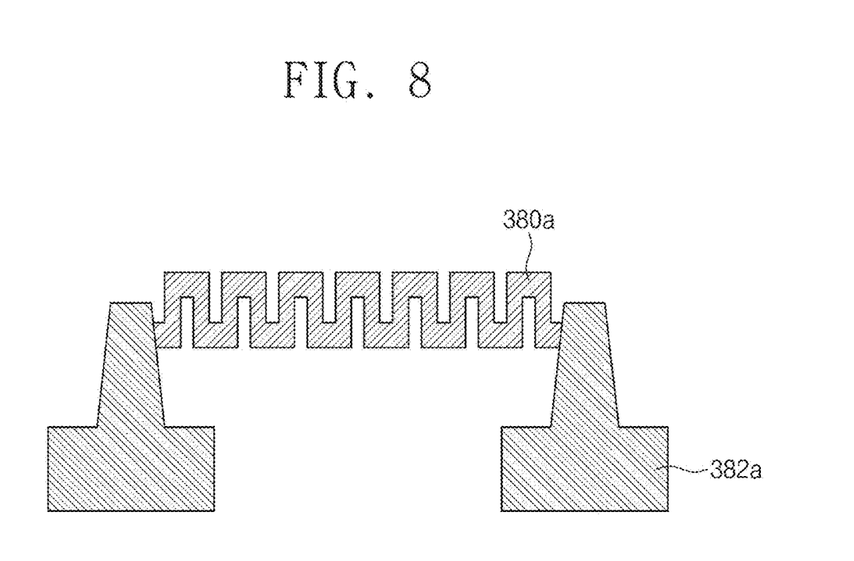
Figure 9:
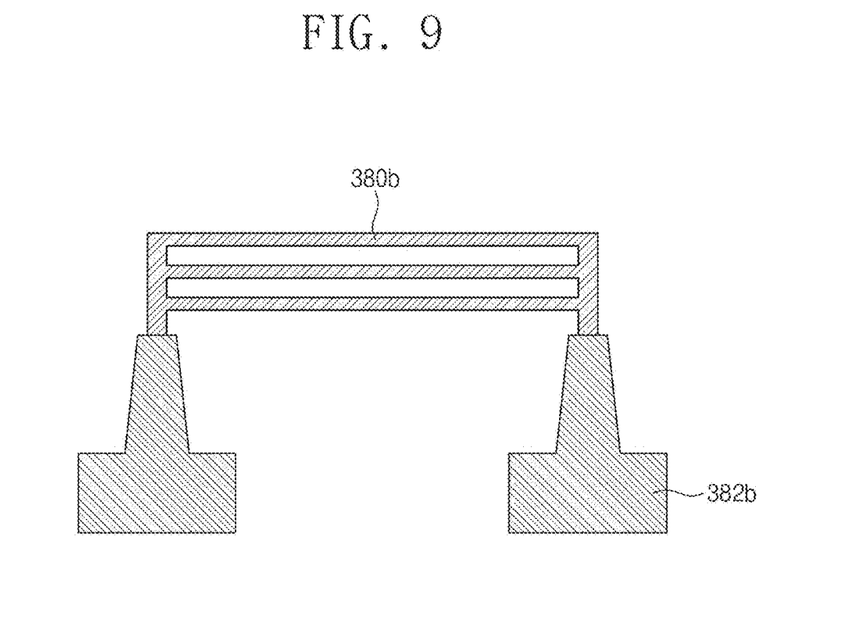
Figure 10:
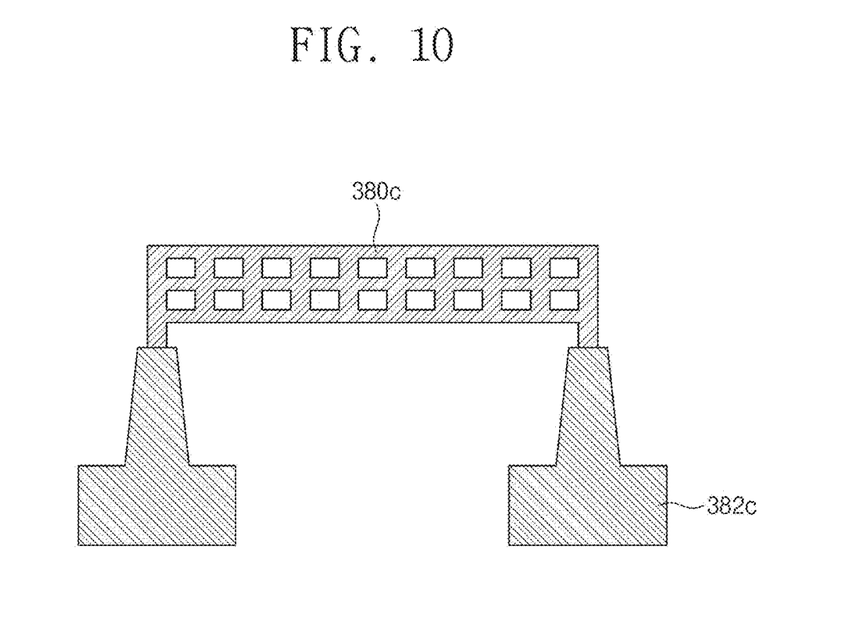

FIG. 6 is a cross-sectional view taken along line V-V' of FIG. 1.

Referring to FIG. 6, the second pad 362 may be connected onto the first current injection electrode 360. The second pad 362 may be disposed on the isolation layer 110, a second column 384 and the second insulation layer 370. The isolation layer 110, the second column 384 and the second insulation layer 370 may be disposed between the second pad 362 and the second lower clad 320. The isolation layer 110, the second column 384 and the second insulation layer 370 may insulate the second pad 362 from the second lower clad 320. The isolation layer 110 may insulate the second pad 362 from the second upper clad 340 and the second Ohmic contact layer 350. The second column 384 may include benzocyclobutene, polyimide, or an insulating material.

The second insulating layer 370 may be disposed on the first current injection electrode 360. Unlike this, the second insulation layer 370 may be disposed on the second column 384. The second insulation layer 370 may be substantially connected to the first insulation layer 270. The second insulation layer 370 may include a dielectric or polyimide.

When the wavelength tuning current is provided through the second pad 362, the second lower clad 320, the gratings 322, the passive waveguide 330, and/or the second upper clad 340 may have changes in refractive index. The wavelength of the laser light 102 may be tuned by a refractive index change of the distributed reflector section 300. For example, when the wavelength tuning current is injected to the passive waveguide 330, the effective refractive index of the passive waveguide 330 may be reduced. The Bragg condition may be determined according to the effective refractive index of the passive waveguide 330. Accordingly, the wavelength of the laser light 102 may be tuned.

Referring to FIGS. 2, 4 and 5 again, the heater electrode 380 may be disposed on the second insulation layer 370. According to an example, the heater electrode 380 may vertically overlap the first current injection electrode 360 and the gratings 322.

FIGS. 7 to 10 show examples of the heater electrode 380 and third pads 382 of FIG. 1.

Referring to FIGS. 1 and 7 to 10, the heater electrode 380 may connect the third pads 382. For example, the heater electrode 380 may have a straight line shape, an uneven shape, a comb shape or a mesh shape.

Referring to FIGS. 4, 5 and 7 to 10, the third pads 382 may be connected to the heater electrode 380. The third pads 382 may be disposed on both edges of the heater electrode 380. Each of the third pads 382 may have various shapes.

Referring to FIGS. 4 and 5, the third pads 382 may be disposed on third columns 386 and the second insulation layer 370. The isolation layer 110, the third columns 386 and the second insulation layer 370 may insulate the third pads 382 from the second lower clad 320. The isolation layer 110 and the second insulation layer 370 may insulate the third pads 382 from the second upper clad 340 and the second Ohmic contact layer 350. For example, the third columns 386 may include benzocyclobutene.

Referring to FIGS. 1, 2, 4 and 5, when heating power is supplied into the heater electrode 380 through the third pads 382, the heater electrode 380 may gradually heat the second upper clad 340, the passive waveguide 330 and the second lower clad 320.

Refractive indexes of the heated second upper clad 340, passive waveguide 330, and second lower clad 320 may be changed. For example, the wavelength of the laser light 102 may be tuned mainly by a refractive index change of the passive waveguide 330.

Figure 11:
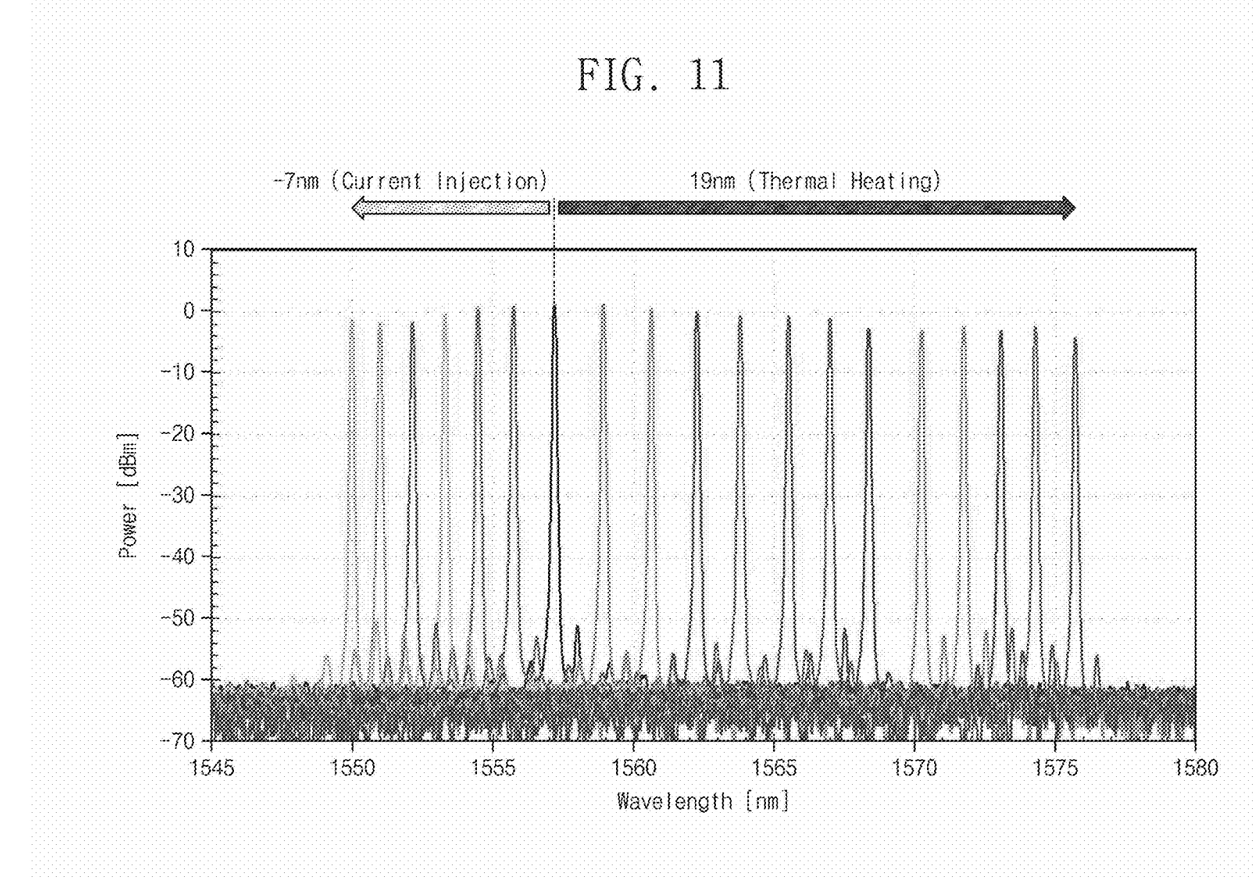
FIG. 11 is a graph showing a change in wavelength of a laser light of FIG. 1.

FIG. 11 shows a wavelength change of the laser light 102 of FIG. 1.

Referring to FIG. 11, the wavelength of the laser light 102 may be changed according to the wavelength tuning current and heating current.

According to an example, the wavelength of the laser light 102 may be shortened by the wavelength tuning current. For example, the wavelength of the laser light 102 may be reduced from about 1557 nm to about 1550 nm in a current range of tens of mA. The wavelength of the laser light 102 may be reduced by about 7 nm. Power peaks between about 1557 nm and about 1550 nm in FIG. 11 may correspond to changes in wavelength of the laser light 102.

According to an example, the wavelength of the laser light 102 may be lengthened by the heating current. For example, the wavelength of the laser light 102 may be increased from about 1557 nm to about 1575 nm in a current range of about 100 mA. The wavelength of the laser light 102 may be increased by about 19 nm. Power peaks between about 1557 nm and about 1575 nm in FIG. 11 may correspond to changes in wavelength range. The above numerical values have been presented to assist understanding of the inventive concept, but are not limited thereto and may be changed in various ways.

The peaks of the laser light 102 of FIG. 11 may exist between about 1557 nm and about 1575 nm.

Figure 12:
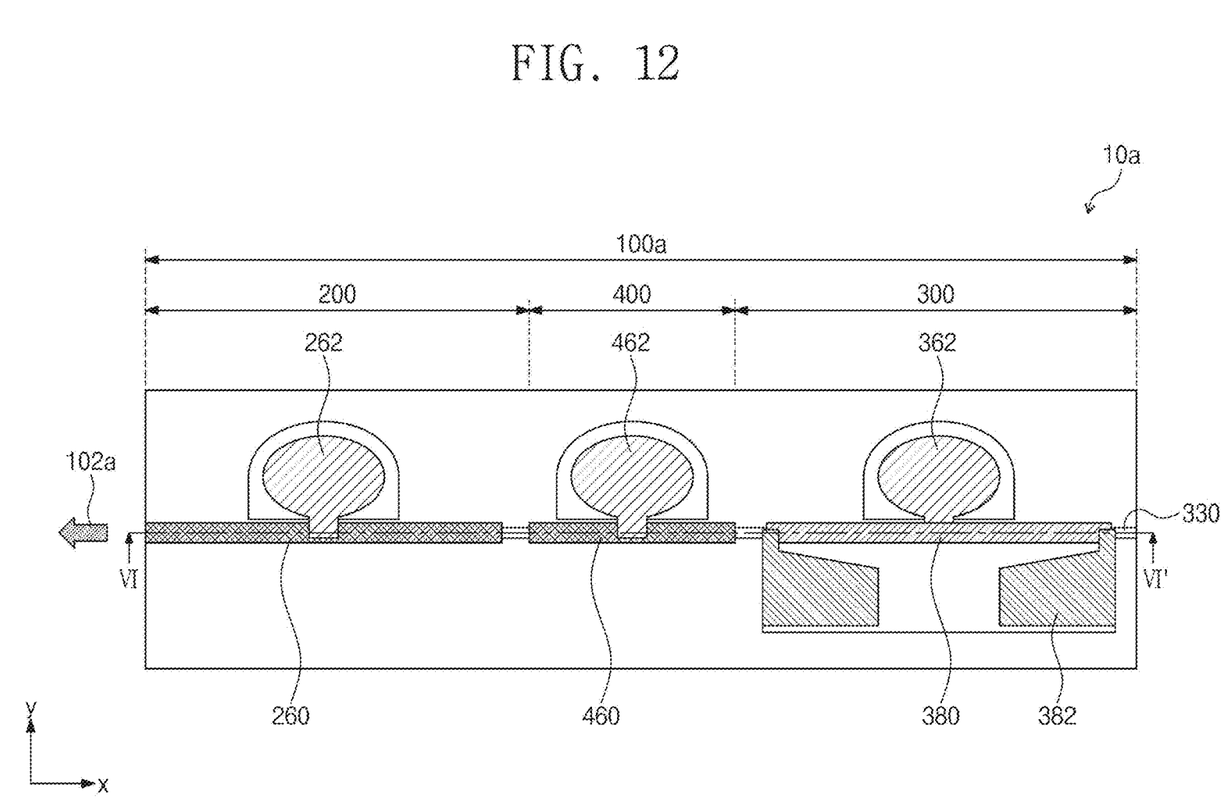
FIG. 12 is a plan view showing an example of a distributed Bragg reflector tunable laser diode according to an embodiment of the inventive concept.
Figure 13:
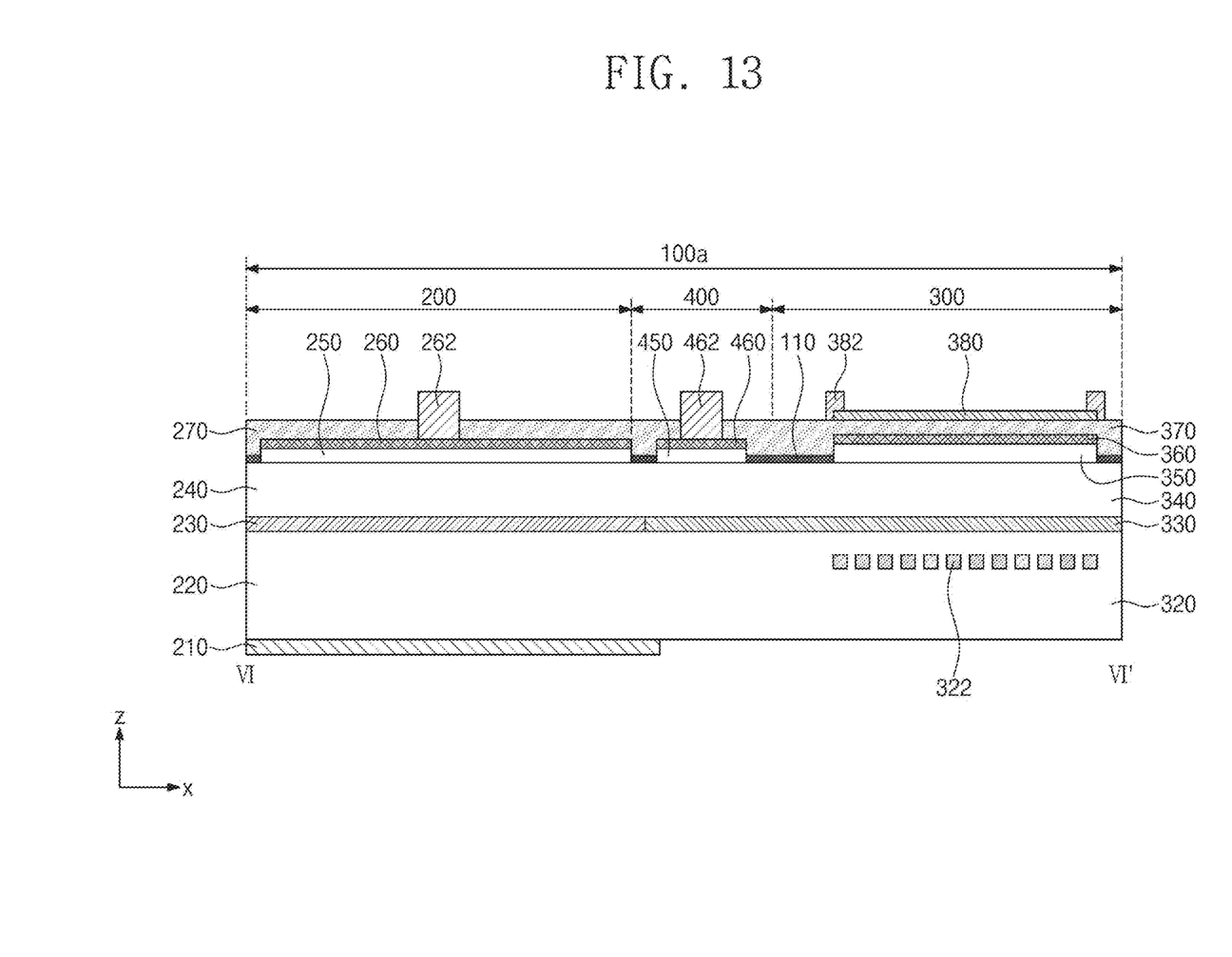
FIG. 13 is a cross-sectional view taken along line VI-VI' of FIG. 12.

FIG. 12 shows an example of a distributed Bragg reflector tunable laser diode 10a according to an embodiment of the inventive concept. FIG. 13 is a cross-sectional view taken along line VI-VI' of FIG. 12.

Referring to FIGS. 12 and 13, the substrate 100a of the distributed Bragg reflector tunable laser diode 10a may include a phase section 400 between a gain section 200 and a distributed reflector section 300. The gain section 200 and the distributed reflector section 300 may be configured identically to those of FIGS. 1 and 2.

The phase section 400 may tune the phase of the laser light 102. According to an example, the phase section 400 may include a third Ohmic contact layer 450 and a second current injection electrode 460 on the passive waveguide 330 and the second upper clad 340. The second current injection electrode 460 may be connected to a fourth pad 462.

The foregoing description is about detailed examples for practicing the inventive concept. The embodiment of the inventive concept disclosure includes not only the above-described embodiments but also simply changed or easily modified embodiments. In addition, the inventive concept may also include technologies obtained by easily modifying and practicing the above-described embodiments.

As described above, a distributed Bragg reflector tunable laser diode according to an embodiment of the inventive concept may include a distributed reflector section having gratings, a current injection electrode and a heater electrode. The gratings, the current injection electrode, and the heater electrode may vertically overlap each other. The current injection electrode may electrically tune a wavelength of laser light by providing a current into a waveguide of the distributed Bragg reflector tunable laser diode. The heater electrode may thermally tune the wavelength of the laser light by heating the waveguide. The wavelength of the laser light may be efficiently tunable.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A distributed Bragg reflector tunable laser diode comprising:
    a substrate including a gain section which has an active waveguide to get gain of a laser light and a distributed reflector section which has a passive waveguide connected to the active waveguide,
    wherein the distributed reflector section comprises:
    gratings disposed on or under the passive waveguide;
    a current injection electrode disposed on the passive waveguide and configured to provide a current into the passive waveguide to electrically tune a wavelength of the laser light; and
    a heater electrode disposed on the current injection electrode and configured to heat the passive waveguide to thermally tune the wavelength of the laser light,
    wherein the gratings, the current injection electrode, and the heater electrode vertically overlap each other.

2. The distributed Bragg reflector tunable laser diode of claim 1, wherein the gain section further comprises:
    a first lower electrode under the active waveguide;
    a first lower clad between the first lower electrode and the active waveguide;
    a first upper clad disposed on the active waveguide; and
    a first upper electrode disposed on the first upper clad.

3. The distributed Bragg reflector tunable laser diode of claim 2, wherein the distributed reflector section further comprises:
    a second lower clad connected to the first lower clad and surrounding the gratings; and
    a second upper clad connected to the first upper clad and disposed on the passive waveguide.

4. The distributed Bragg reflector tunable laser diode of claim 3, wherein the distributed reflector section further comprises a second lower electrode connected to the first lower electrode and disposed under the second lower clad.

5. The distributed Bragg reflector tunable laser diode of claim 3, wherein the gain section further comprises a first contact electrode between the first upper clad and the first upper electrode,
    wherein the distributed reflector section further comprises a second contact electrode between the second upper clad and the current injection electrode.

6. The distributed Bragg reflector tunable laser diode of claim 5, wherein the distributed reflector section further comprises an insulation layer between the current injection electrode and the heater electrode.

7. The distributed Bragg reflector tunable laser diode of claim 6, wherein the insulation layer is disposed between the first and second contact electrodes.

8. The distributed Bragg reflector tunable laser diode of claim 7, wherein the distributed reflector section further comprises:
   first and second pads connected to the current injection electrode and the heater electrode; and
   first and second columns disposed between the first and second pads and the first and second lower clads.

9. The distributed Bragg reflector tunable laser diode of claim 8, wherein the first and second columns comprise benzocyclobutene.

10. The distributed Bragg reflector tunable laser diode of claim 1, wherein the substrate further comprises a phase section between the gain section and the distributed reflector section.

11. The distributed Bragg reflector tunable laser diode of claim 1, wherein the heater electrode has a straight line shape, an uneven shape, a comb shape, or a mesh shape.

12. The distributed Bragg reflector tunable laser diode of claim 1, wherein the substrate comprises InP.

13. The distributed Bragg reflector tunable laser diode of claim 1, wherein the current reduces the wavelength of the laser light.

14. The distributed Bragg reflector tunable laser diode of claim 13, wherein the wavelength of the laser light is increased by heating the passive waveguide.

* * * * *